(12) United States Patent
Chang et al.

(10) Patent No.: US 9,905,578 B2
(45) Date of Patent: Feb. 27, 2018

(54) PIXEL STRUCTURE AND METHOD OF MANUFACTURING A PIXEL STRUCTURE

(71) Applicant: Au Optronics Corporation, Hsinchu (TW)

(72) Inventors: Wei-Jen Chang, Taipei (TW); Wan-Yu Lo, Hsinchu (TW); Po-Hsueh Chen, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/285,478

(22) Filed: Oct. 4, 2016

(65) Prior Publication Data
US 2017/0025445 A1    Jan. 26, 2017

Related U.S. Application Data

(62) Division of application No. 13/858,909, filed on Apr. 8, 2013, now Pat. No. 9,502,573.

(30) Foreign Application Priority Data

Jul. 13, 2012    (TW) .............................. 101125365 A

(51) Int. Cl.
*H01L 21/336* (2006.01)
*H01L 27/13* (2006.01)
(Continued)

(52) U.S. Cl.
CPC ...... *H01L 27/1225* (2013.01); *H01L 27/1248* (2013.01); *H01L 27/1255* (2013.01);
(Continued)

(58) Field of Classification Search
CPC ............ H01L 27/1225; H01L 27/1248; H01L 27/1255; H01L 27/1259; H01L 29/66742; H01L 27/66765
See application file for complete search history.

(56) References Cited

U.S. PATENT DOCUMENTS 5,245,450 A * 9/1993 Ukai ................. G02F 1/136213
345/87
6,714,267 B2 * 3/2004 Choi ................. G02F 1/136213
257/59

(Continued)

FOREIGN PATENT DOCUMENTS

JP    8-184852    * 7/1996 ............. G02F 1/136

*Primary Examiner* — Mary Wilczewski
(74) *Attorney, Agent, or Firm* — JCIPRNET

(57) ABSTRACT

A pixel structure and a method of manufacturing a pixel structure are provided. The pixel structure includes an active device, a gate insulation layer, a dielectric insulation layer, a capacitance electrode, a protection layer and a pixel electrode. The active device includes a gate, a semiconductor channel layer, a source and a drain. The dielectric insulation layer covers the semiconductor channel layer. A dielectric index of the dielectric insulation layer is greater than a dielectric index of the gate insulation layer. The capacitance electrode is overlapped with the drain. The capacitance electrode, the drain and the dielectric insulation layer between the two constitute a storage capacitor structure. The protection layer is disposed on the dielectric insulation layer and the capacitance electrode is located between the protection layer and the dielectric insulation layer. The pixel electrode is disposed on the protection layer and connected to the drain of the active device.

11 Claims, 11 Drawing Sheets

(51) Int. Cl.
   *H01L 27/12* (2006.01)
   *H01L 29/786* (2006.01)
   *H01L 29/66* (2006.01)
   *H01L 29/22* (2006.01)
   *H01L 29/24* (2006.01)
   *H01L 29/423* (2006.01)

(52) U.S. Cl.
   CPC .......... *H01L 27/1259* (2013.01); *H01L 29/22* (2013.01); *H01L 29/24* (2013.01); *H01L 29/42356* (2013.01); *H01L 29/66742* (2013.01); *H01L 29/66969* (2013.01); *H01L 29/7869* (2013.01)

(56) References Cited

U.S. PATENT DOCUMENTS

| | | | | |
|---|---|---|---|---|
| 6,797,961 B2* | 9/2004 | Choo | ............... | H01L 27/1214 250/370.08 |
| 6,867,822 B2* | 3/2005 | Kim | ............... | G02F 1/136213 349/113 |
| 6,927,820 B2* | 8/2005 | Jang | ............... | G02F 1/133512 257/E27.111 |
| 2002/0020294 A1* | 2/2002 | Mori | ............... | B01D 53/1456 95/226 |
| 2002/0024097 A1* | 2/2002 | Joo | ............... | H01L 27/14609 257/359 |
| 2003/0038241 A1* | 2/2003 | Choo | ............... | H01L 27/1214 250/370.09 |
| 2003/0053005 A1* | 3/2003 | Song | ............... | G02F 1/136213 349/43 |
| 2003/0058377 A1* | 3/2003 | Chae | ............... | G02F 1/136213 349/43 |
| 2003/0122990 A1* | 7/2003 | Kim | ............... | G02F 1/134363 349/43 |
| 2003/0141811 A1* | 7/2003 | Park | ............... | H01L 27/3265 313/506 |
| 2004/0124414 A1* | 7/2004 | Jang | ............... | G02F 1/133512 257/59 |
| 2005/0258425 A1* | 11/2005 | Izumi | ............... | H01L 27/14665 257/72 |
| 2006/0091395 A1* | 5/2006 | Lee | ............... | H01L 51/0529 257/71 |
| 2007/0092661 A1* | 4/2007 | Ryuzaki | ............... | G02F 1/1362 428/1.1 |
| 2007/0284596 A1* | 12/2007 | Yoshinaga | ............... | G02F 1/136213 257/88 |
| 2008/0213940 A1* | 9/2008 | Lee | ............... | C23C 16/405 438/104 |
| 2009/0086146 A1* | 4/2009 | Wakabayashi | ............... | G02F 1/134363 349/141 |
| 2009/0213039 A1* | 8/2009 | Ito | ............... | H01L 27/12 345/30 |
| 2009/0244468 A1* | 10/2009 | Taniguchi | ............... | G02F 1/134363 349/141 |
| 2010/0044711 A1* | 2/2010 | Imai | ............... | H01L 27/14676 257/59 |
| 2010/0097538 A1* | 4/2010 | Ota | ............... | G02F 1/136204 349/48 |
| 2010/0193782 A1* | 8/2010 | Sakata | ............... | H01L 29/7869 257/43 |
| 2011/0220906 A1* | 9/2011 | Huang | ............... | H01L 27/1225 257/72 |
| 2012/0061661 A1* | 3/2012 | Liu | ............... | H01L 29/78606 257/43 |

\* cited by examiner

PIXEL STRUCTURE AND METHOD OF MANUFACTURING A PIXEL STRUCTURE

CROSS-REFERENCE TO RELATED APPLICATION

This application is a divisional application of and claims the priority benefit of a prior application Ser. No. 13/858,909, filed on Apr. 8, 2013, now allowed. The prior application Ser. No. 13/858,909 claims the priority benefit of Taiwan application serial no. 101125365, filed on Jul. 13, 2012. The entirety of each of the above-mentioned patent applications is hereby incorporated by reference herein and made a part of this specification.

BACKGROUND OF THE INVENTION

Field of the Invention

The present invention relates to a pixel structure and a manufacturing method thereof, and particularly, the invention relates to a pixel structure having a high aperture ratio and a manufacturing method thereof.

Description of Related Art

Currently, conventional flat-panel displays have pixel structures to constitute minimum basic elements needed for displaying images, wherein each pixel structure generally includes an active device and a pixel electrode. Generally, when the active devices in specific pixel structures are activated via corresponding scanning lines, operating voltages provided by data lines are inputted to the pixel electrodes via the activated active devices so as to display the corresponding display data. In addition, the pixel structure further includes a storage capacitor such that the pixel structure has a function of maintaining voltages. In other words, the storage capacitor is utilized to store the operating voltage inputted to the pixel electrode via the active device so as to maintain the stability of the display image displayed by the pixel structure.

The storage capacitor is, generally, constituted of capacitance electrodes formed by metal patterns in the pixel structure. In order to increase the capacitance of the storage capacitor for reaching good stability of the display image, an area of capacitance electrodes overlapping with each other is usually enlarged. However, such a design indicates that the disposition area of the metal pattern has to be enlarged and a display aperture ratio of the pixel structure is thus decreased.

SUMMARY OF THE INVENTION

The invention provides a pixel structure having a desirable display aperture ratio and sufficient storage capacitance.

The invention provides a method of manufacturing a pixel structure utilizing an insulation layer having a high dielectric index as a dielectric layer of a storage capacitor, and allowing the storage capacitor structure to be capable of providing sufficient storage capacitance without occupying large layout area so as to enhance a display aperture ratio.

The invention provides a pixel structure disposed on a substrate. The pixel structure includes an active device, a gate insulation layer, a dielectric insulation layer, a capacitance electrode, a protection layer and a pixel electrode. The active device disposed on the substrate includes a gate, a semiconductor channel layer, a source and a drain. The source and the drain are disposed above the gate and separated by a gap such that the gate has at least a portion that is not overlapped with the source and the drain, and the semiconductor channel layer is at least disposed in the gap between the source and the drain. The gate insulation layer is disposed between the gate and the semiconductor channel layer, and the source and the drain are disposed between the gate insulation layer and the semiconductor channel layer. The dielectric insulation layer is disposed above the substrate and covers the semiconductor channel layer, wherein a dielectric index of the dielectric insulation layer is great than a dielectric index of the gate insulation layer. The capacitance electrode is disposed above the dielectric insulation layer and the capacitance electrode is overlapped with the drain such that the capacitance electrode, the drain and the dielectric insulation layer sandwiched between the two constitute a storage capacitor structure. The protection layer is disposed above the dielectric insulation layer and the capacitance electrode is disposed between the protection layer and the dielectric insulation layer. The pixel electrode is disposed above the protection layer and connected to the drain of the active device.

In an embodiment of the invention, the dielectric index of the dielectric insulation layer ranges from 5 to 10.

In an embodiment of the invention, a material of the dielectric insulation layer includes aluminum oxide ($Al_2O_3$) or titanium dioxide ($TiO_2$).

In an embodiment of the invention, a film thickness of the dielectric insulation layer ranges from 100 Å to 800 Å.

In an embodiment of the invention, the dielectric insulation layer has a first contact opening exposing the drain and the protection layer has a second contact opening communicated with the first contact opening such that the pixel electrode is connected to the drain via the first contact opening and the second contact opening communicated with each other.

In an embodiment of the invention, a material of the semiconductor channel layer includes an oxide semiconductor material. The oxide semiconductor material comprises Indium-Gallium-Zinc Oxide (IGZO), Zinc Oxide (ZnO), Stannic Oxide (SnO), Indium-Zinc Oxide (IZO), Gallium-Zinc Oxide (GZO), Zinc-Tin Oxide (ZTO) or Indium-Tin Oxide (ITO). The pixel structure further includes a channel protection layer disposed on a top surface of the semiconductor channel layer. A material of the channel protection layer includes Indium-Gallium-Zinc Oxynitride (IGZON), Zinc Oxynitride (ZnON), Stannic Oxynitride (SnON), Indium-Zinc Oxynitride (IZON), Gallium-Zinc Oxynitride (GZON), Zinc-Tin Oxynitride (ZTON) or Indium-Tin Oxynitride (ITON).

The invention further provides a method of manufacturing a pixel structure including the following steps: forming a gate above a substrate; forming a gate insulating layer on the substrate to cover the gate; forming a source and a drain above the gate insulation layer, wherein the source and the drain above the gate are separated by a gap such that the gate has at least one portion that is not overlapped with the source and the drain; forming a semiconductor channel layer above the source and the drain and the semiconductor channel layer is at least disposed in the gap; forming a dielectric insulation layer above the substrate to cover the source, the drain and the semiconductor channel layer, wherein a dielectric index of the dielectric insulation layer is great than a dielectric index of the gate insulation layer; forming a capacitance electrode above the dielectric insulation layer, wherein the capacitance electrode is overlapped with the drain such that the capacitance electrode, the drain and the dielectric insulation layer sandwiched between the two constitute a storage capacitor structure; forming a protection layer above the dielectric insulation layer to cover the capacitance electrode; and forming a pixel electrode on the protection layer and connected to the drain.

In an embodiment of the invention, the step of forming the source and the drain, the step of forming the dielectric insulation layer and the step of forming the capacitance electrode are processed sequentially.

In an embodiment of the invention, a material of the dielectric insulation layer includes silicon oxide or titanium dioxide.

In an embodiment of the invention, the dielectric index of the dielectric insulation layer ranges from 5 to 10.

In an embodiment of the invention, the step of forming the semiconductor channel layer is processed after the source and the drain are formed.

In an embodiment of the invention, a material of the semiconductor channel layer includes an oxide semiconductor material. A step of forming a channel protection layer on a top surface of the semiconductor channel layer is further included. The step of forming the channel protection layer includes performing a nitridation process to the semiconductor channel layer in a chamber for depositing the oxide semiconductor material as the semiconductor channel layer. The oxide semiconductor material includes Indium-Gallium-Zinc Oxide (IGZO), Zinc Oxide (ZnO), Stannic Oxide (SnO), Indium-Zinc Oxide (IZO), Gallium-Zinc Oxide (GZO), Zinc-Tin Oxide (ZTO) or Indium-Tin Oxide (ITO). In addition, a material of the channel protection layer includes Indium-Gallium-Zinc Oxynitride (IGZON), Zinc Oxynitride (ZnON), Stannic Oxynitride (SnON), Indium-Zinc Oxynitride (IZON), Gallium-Zinc Oxynitride (GZON), Zinc-Tin Oxynitride (ZTON) or Indium-Tin Oxide Nitride (ITON).

In an embodiment of the invention, a method of manufacturing the pixel structure further includes forming a first contact opening exposing the drain above the dielectric insulation layer and forming a second contact opening communicated with the first contact opening above the protection layer such that the pixel electrode manufactured subsequently is connected to the drain via the first contact opening and the second contact opening communicated with each other.

In view of the foregoing, in the invention, the drain in the pixel structure is disposed between the gate and the capacitance electrode, and a dielectric index of the dielectric insulation layer between the capacitance electrode and the drain is greater than a dielectric index of the gate insulation layer between the gate and the drain. Therefore, it is not required to have the capacitance electrode with large area for the pixel structure in the invention to obtain sufficient storage capacitance and helps to increase a display aperture ratio of the pixel structure.

In order to make the aforementioned features and advantages of the invention more comprehensible, embodiments accompanying figures are described in details below.

BRIEF DESCRIPTION OF THE DRAWINGS

FIG. 1A to FIG. 6A illustrate schematic top views of components manufactured in each step in a method of manufacturing a pixel structure according to an embodiment of the invention.

FIG. 1B to FIG. 6B are schematic cross-sectional views taken along a section line I-I' of FIG. 1A to FIG. 6A, respectively.

DESCRIPTION OF EMBODIMENTS

Figure 1A:
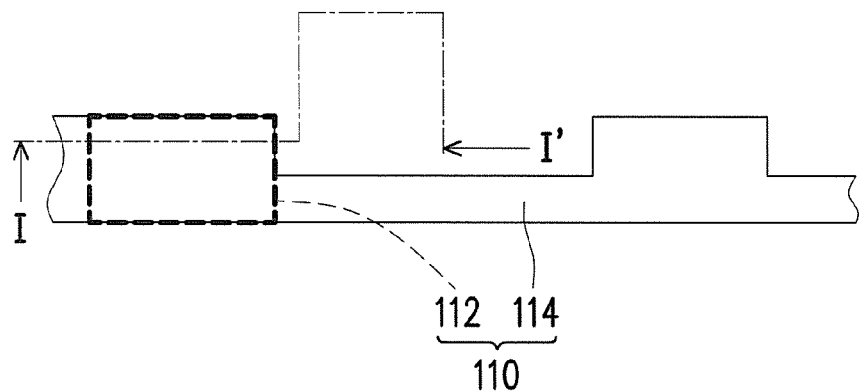
Figure 1B:
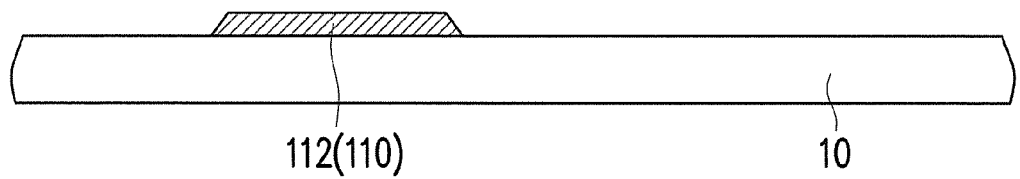

FIG. 1A to FIG. 6A illustrate schematic top views of components manufactured in each step in a method of manufacturing a pixel structure according an embodiment of the invention and FIG. 1B to FIG. 6B are schematic cross-sectional views taken along a section line I-I' of FIG. 1A to FIG. 6A, respectively. Referring to FIG. 1A and FIG. 1B first, a method of manufacturing a pixel structure according to an embodiment of the invention includes forming a patterned conductive layer 110 on a substrate 10 to define a gate 112 and a scanning line 114 where the gate 112 connected thereto. Specifically, the gate 112 and the scanning line 114 are constructed by a successive pattern of the patterned conductive layer 110 and therefore the gate 112 can be regarded as one portion of the scanning line 114. However, in other embodiments, the patterned conductive layer 110 can include a linear pattern having a substantially fixed line width and a branch pattern connected to the linear pattern, wherein the scanning line 114 can be constituted of the linear pattern having the fixed line width and the gate 112 can be constituted of the branch pattern.

A material of the patterned conductive layer 110 can be a metal material or other conductive materials. Herewith, a method of manufacturing the patterned conductive layer 110 can include forming a conductive material layer (not shown) on the substrate 10 and then patterning the conductive material layer (not shown) to constitute the patterned conductive layer 110, in which the step of patterning can include lithography and etching processes, but is not limited thereto. For the time being, the step of forming the patterned conductive layer 110 can use a mask. In another embodiment, a method of manufacturing the patterned conductive layer 110 can include forming a conductive material on a partial area of the substrate 10 through a printing process to constitute the patterned conductive layer 110.

Figure 2A:
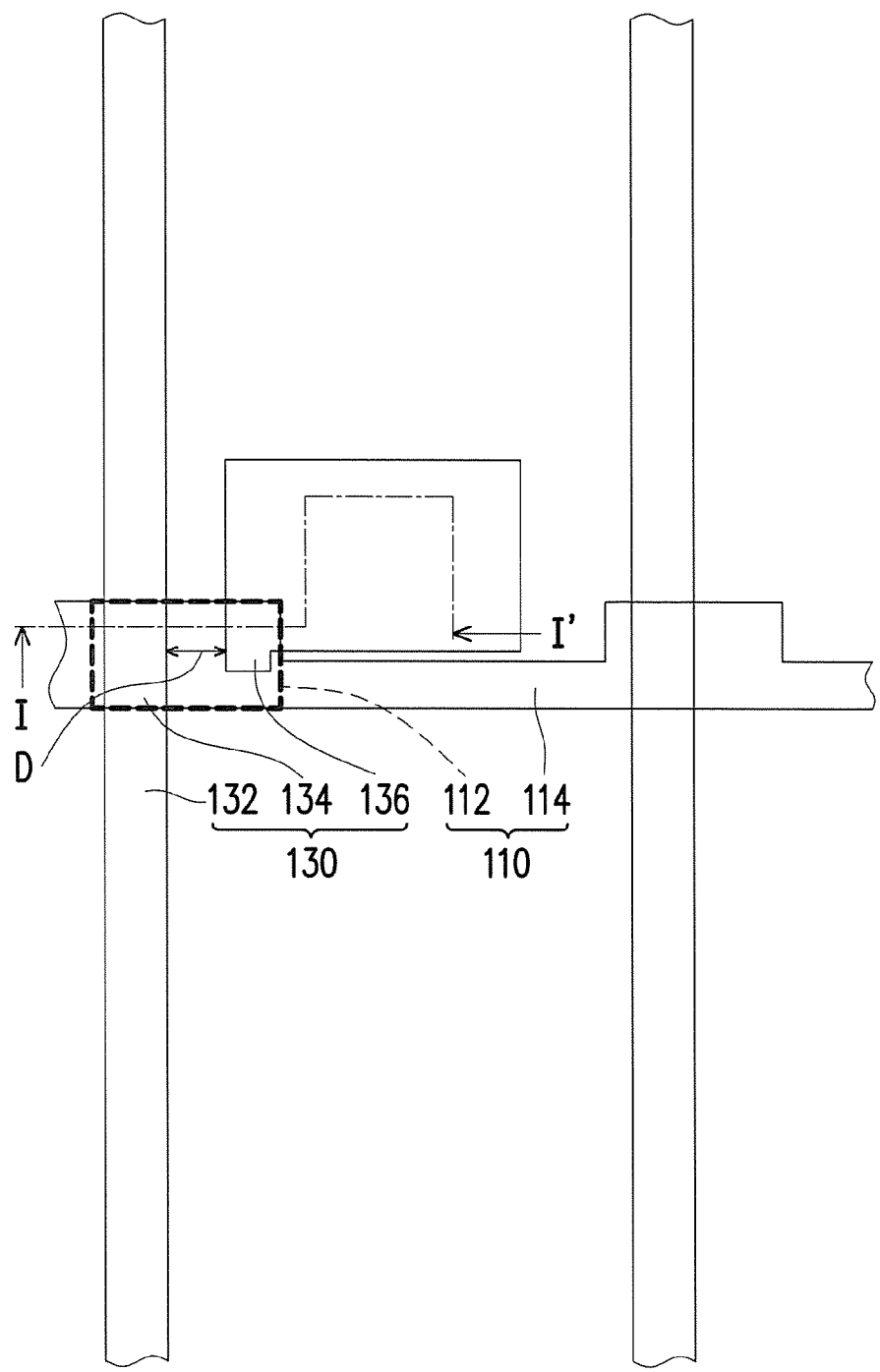
Figure 2B:
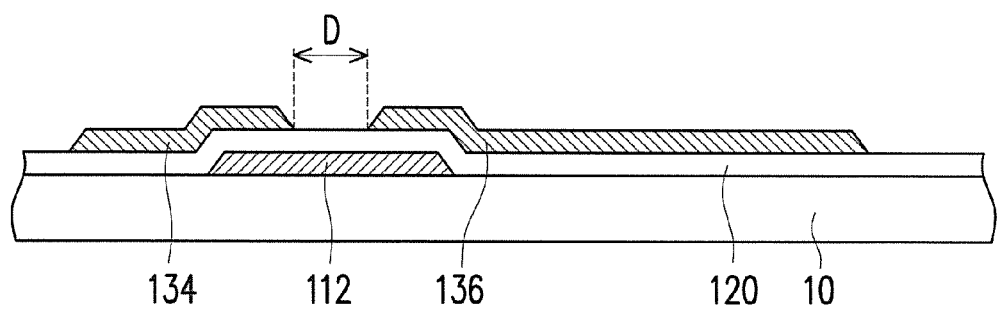

Next, referring to FIG. 2A and FIG. 2B, a gate insulation layer 120 covering the patterned conductive layer 110 is formed on the substrate 10 and another patterned conductive layer 130 is formed on the gate insulation layer 120. Herewith, a material of the gate insulation layer 120 includes an insulation material such as silicon oxide, silicon nitride and the like, and a material of the patterned conductive layer 130 can include a metallic material or non-metallic conductive material, such as metallic oxide conductive material or the like. A method of manufacturing the patterned conductive layer 130 can include forming a conductive material layer (not shown) on the substrate 10 and then patterning the conductive material layer (not shown) to constitute the patterned conductive layer 130, wherein the step of patterning can include lithography and etching processes. In other words, the step of forming the patterned conductive layer 130 according to the present embodiment can use another mask.

The patterned conductive layer 130 includes a data line 132, a source 134 and a drain 136. The source 134 and the drain 136 above the gate 112 are separated from each other by a gap D and partially overlapped with the gate 112 such that the gate 112 has at least a portion that is not overlapped with the source 134 and the drain 136. In other words, the gap D is substantially located above the gate 112 in a thickness direction such that the gate 112 in the gap D is not shielded by or overlapped with the source 134 and the drain 136. According to the present embodiment, the source 134 can be one portion of the data line 132, but the invention is not limited thereto. In other description of embodiments, the source 134 can be constituted of a conductive pattern connected to the data line 132.

Figure 3A:
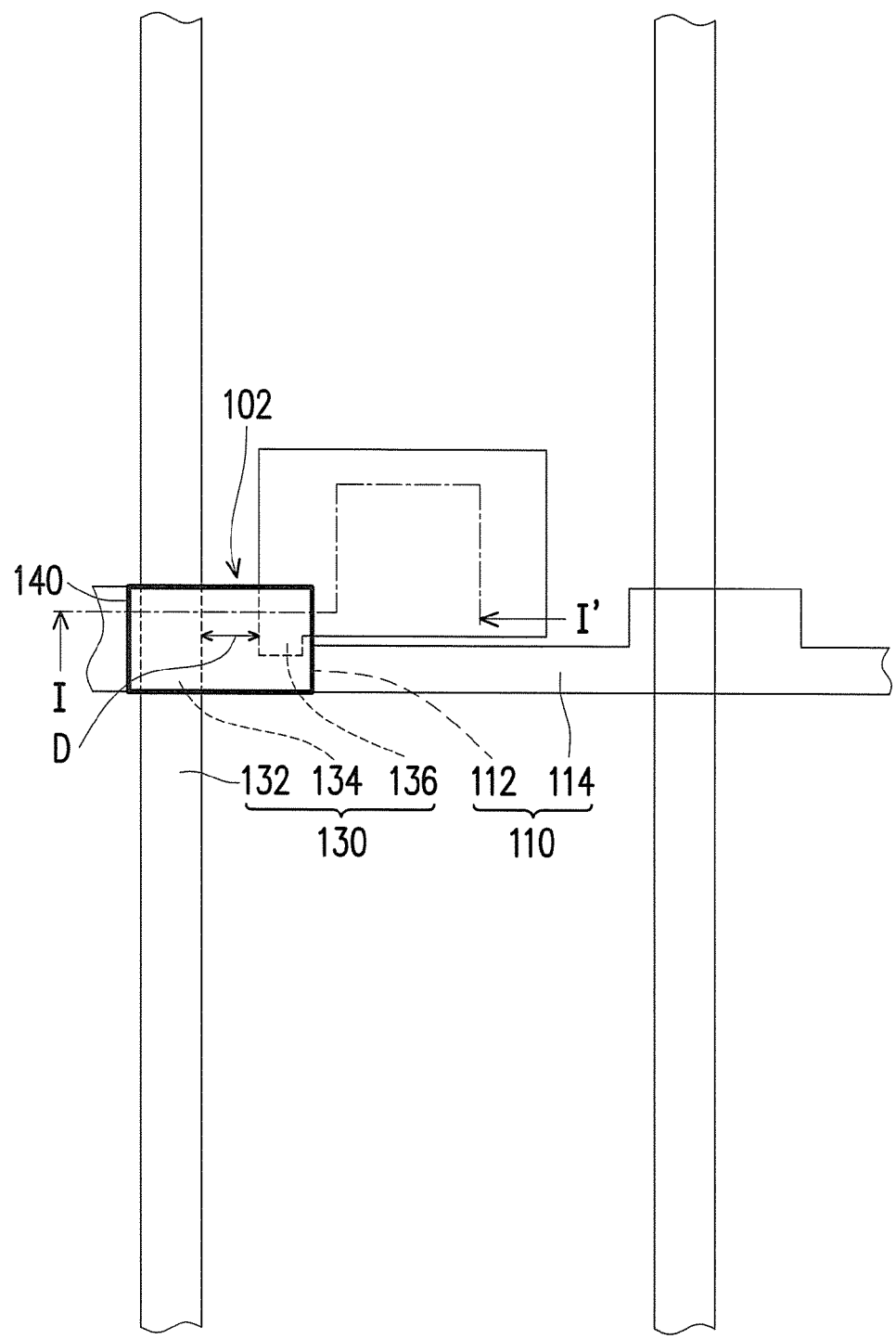
Figure 3B:
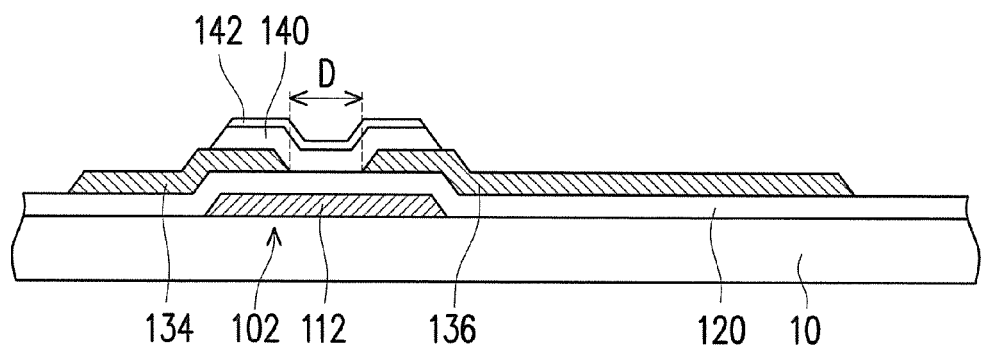

Then, referring to FIG. 3A and FIG. 3B at the same time, a semiconductor channel layer 140 is formed on and partially overlapped with the source 134 and the drain 136. The step of forming the semiconductor channel layer 140 can include forming a semiconductor material layer (not shown) on the substrate 10, and then patterning the semiconductor material layer (not shown) into the semiconductor channel layer 140. The step of patterning can include lithography and etching processes. In other words, the step of forming the semiconductor channel layer 140 can use further another mask.

Specifically, the semiconductor channel layer 140 is, for example, at least disposed in the gap D configured between the source 134 and the drain 136 such that the semiconductor channel layer 140 is connected between the source 134 and the drain 136. In addition, the semiconductor channel layer 140 substantially defines a location of the gate 112, that is, a portion of the patterned conductive layer 110 overlapped with the semiconductor channel layer 140 is the gate 112 and the rest portion of the patterned conductive layer 110 can be the scanning line 114. In this way, an active device 102 is constituted of the gate 112, the source 134, the drain 136 and the semiconductor channel layer 140 together.

In addition, the gate insulation layer 120 is disposed between the gate 112 and the semiconductor channel layer 140, and the source 134 and the drain 136 are disposed between the gate insulation layer 120 and the semiconductor channel layer 140. It is known, from such a stacking structure, that the active device 102 is a co-planar type thin film transistor (TFT). In other words, the step of forming the semiconductor channel layer 140 is processed after the source 134 and the drain 136 are formed. However, the invention is not limited thereto.

A material of the semiconductor channel layer 140 can be amorphous silicon, polysilicon, organic semiconductor material or oxide semiconductor material. In other words, any semiconductor material can be chosen to form the semiconductor channel layer 140. If a material of the semiconductor channel layer 140 is oxide semiconductor material, a protection layer 142 can be selectively disposed on a top surface of the semiconductor channel layer 140. In other words, the protection layer 142 can be disposed on a surface of the semiconductor channel layer 140 away from the gate 112 such that the semiconductor channel layer 140 is disposed between the protection layer 142 and the gate insulation layer 120, and disposed between the protection layer 142 and the source 134 and the drain 136 constituted by the patterned conductive layer 130.

It is to be noted that a method of forming the protection layer 142 can be injecting nitrogen gas into the chamber for deposing the oxide semiconductor material prior to the end of the deposition process of the oxide semiconductor material. As a result, the semiconductor channel layer 140 and the protection layer 142 contain the same metallic element, and a material of the protection layer 142 is substantially an oxynitride semiconductor. Generally, an oxide semiconductor material for the semiconductor channel layer 140 includes Indium-Gallium-Zinc Oxide (IGZO), Zinc Oxide (ZnO), Stannic Oxide (SnO), Indium-Zinc Oxide (IZO), Gallium-Zinc Oxide (GZO), Zinc-Tin Oxide (ZTO) or Indium-Tin Oxide (ITO). Therefore, a material of the protection layer 142 correspondingly includes Indium-Gallium-Zinc Oxynitride (IGZON), Zinc Oxynitride (ZnON), Stannic Oxynitride (SnON), Indium-Zinc Oxynitride (IZON), Gallium-Zinc Oxynitride (GZON), Zinc-Tin Oxynitride (ZTON) or Indium-Tin Oxynitride (ITON).

In the present embodiment, the oxynitride semiconductor and the oxide semiconductor material can be formed in the same deposition chamber using in-situ deposition procedures or successively deposition procedures. Therefore, in the process of forming the oxynitride semiconductor and the oxide semiconductor material on the substrate 10, the substrate 10 does not leave the deposition chamber. Therefore, the oxide semiconductor material is always covered by the oxynitride semiconductor and is not exposed in an atmospheric environment. As a result, the protection layer 142 constituted by oxynitride semiconductor can provide suitable protection effect such that the semiconductor channel layer 140 constituted by the oxide semiconductor material is not affected by moisture and oxygen in the atmospheric environment and has better electrical performance. However, a disposition and a manufacturing of the protection layer 142 are used only for demonstration and illustration and are not intended to limit the invention thereto. In other embodiments, when a material of the semiconductor channel layer 140 is a material less likely be affected by moisture such as polysilicon or amorphous silicon, the semiconductor channel layer 140 does not need to be covered by the protection layer 142.

Figure 4A:
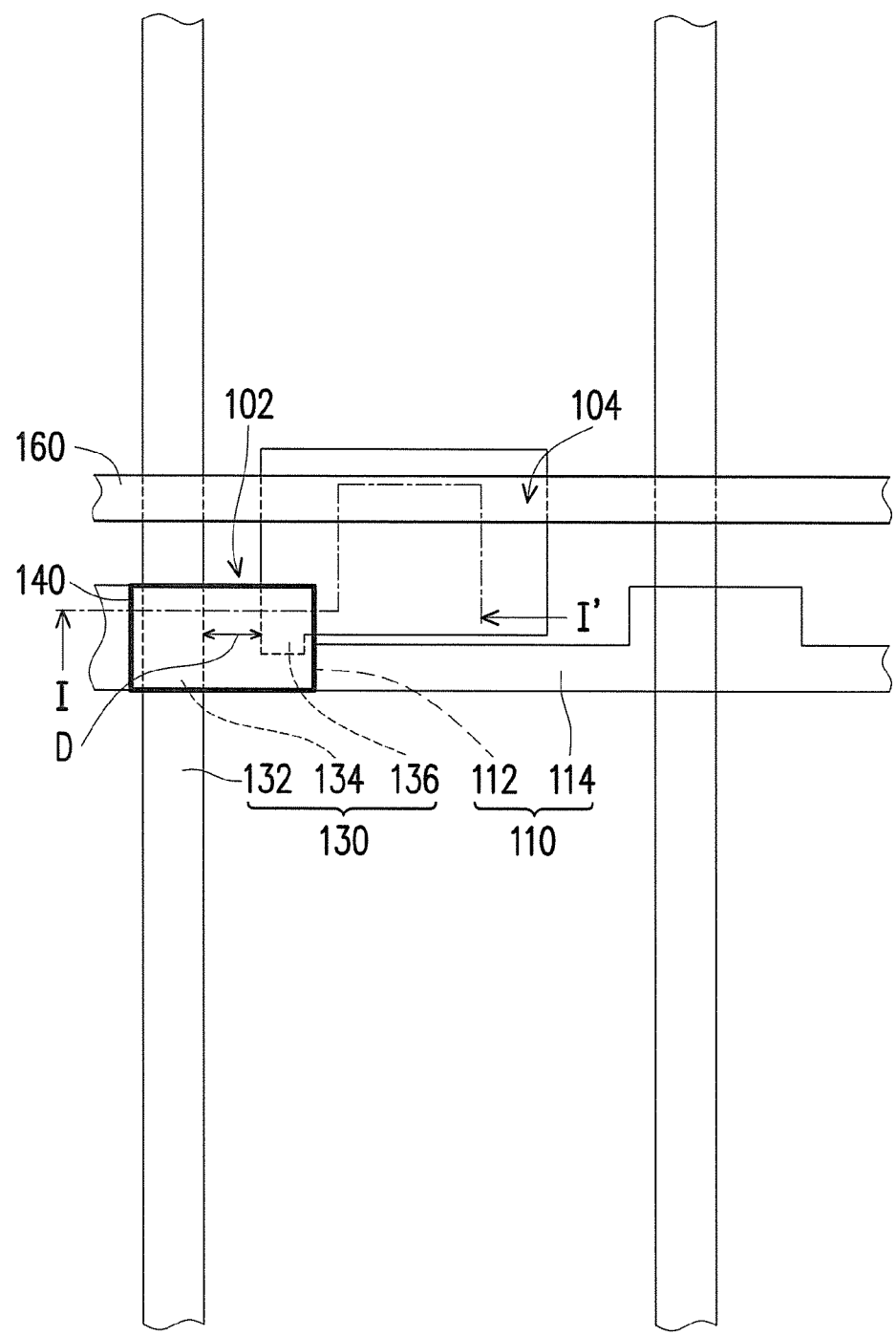
Figure 4B:
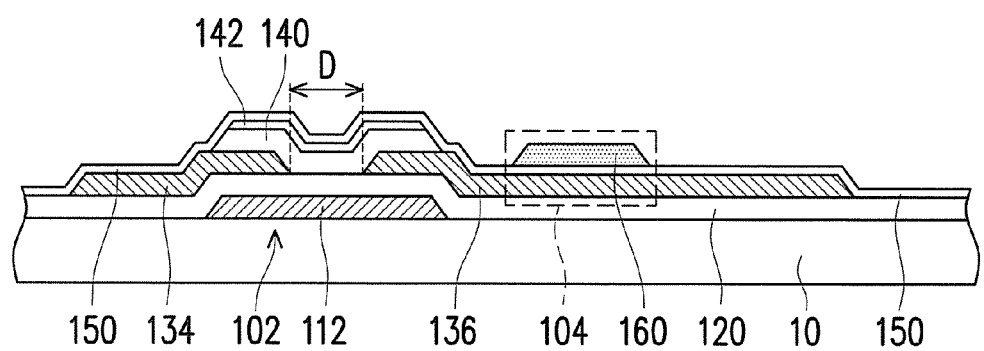

Later, referring to FIG. 4A and FIG. 4B, a dielectric insulation layer 150 is formed on the substrate 10 and a capacitance electrode 160 is formed on the dielectric insulation layer 150. The dielectric insulation layer 150 is disposed on the substrate 10 and covers the active device 102, and the capacitance electrode 160 is disposed on the dielectric insulation layer 150. In addition, the capacitance electrode 160 is overlapped with the drain 136 such that the capacitance electrode 160, the drain 136 and the dielectric insulation layer 150 sandwiched therebetween constitute a storage capacitor structure 104. In present embodiment, the step of forming the source 134 and the drain 136, the step of forming the dielectric insulation layer 150 and the step of forming the capacitance electrode 160 are processed successively to form the storage capacitor structure 104. In other words, the storage capacitor structure 104 is constituted by the drain 136, the dielectric insulation layer 150 and the capacitance electrode 160 in a way of stacking upward successively from the substrate 10.

Herewith, a method of manufacturing the capacitance electrode 160 can include, first, forming a conductive material layer (not shown) on the dielectric insulation layer 150 and then patterning the conductive material layer(not shown) to constitute the capacitance electrode 160, wherein the step of patterning can include lithography and etching processes. In other words, the step of forming the capacitance electrode 160 can use again another mask. The capacitance electrode 160 is, for example, manufactured by a conductive material such as metals and the capacitance electrode 160 can cross the data line 132 and, for example, is disposed parallel to the scanning line 114. Overall, the present embodiment, for example, utilizes three conductive layers to constitute the active device 102 and the capacitor structure 104.

In addition, the step of forming the dielectric insulation layer 150 is, for example, performing a physical vapor deposition (PVD), and the dielectric insulation layer 150 can be manufactured by utilizing an insulation material with higher dielectric index. For example, a material of the dielectric insulation layer 150 includes aluminum oxide, titanium oxide, or other metallic oxide material that can be utilized to manufacture by the physical vapor deposition or the sputtering process, wherein aluminum oxide includes $Al_2O_3$ and titanium oxide includes $TiO_2$.

Take the present embodiment as an example, a material of the gate insulation layer 120 is, for example, silicon oxide or silicon nitride, and a material of the dielectric insulation layer 150 includes aluminum oxide or titanium oxide. As a result, a dielectric index of the dielectric insulation layer 150 is greater than a dielectric index of the gate insulation layer 120, wherein the dielectric index of the dielectric insulation layer 150, for example, ranges from 5 to 10. Due to that the dielectric index of the dielectric insulation layer 150 is greater than the dielectric index of the gate insulation layer 120, a film thickness of the dielectric insulation layer 150 ranges approximately from 100 Å to 800 Å which is capable of providing sufficient dielectric properties. In comparison, it may has a film thickness of 500 Å to 1500 Å for the gate insulation layer 120 to be capable of providing sufficient dielectric properties. Therefore, the film thickness of the dielectric insulation layer 150 of the present embodiment can be thinner than the film thickness of the gate insulation layer 120.

It is to be noticed that a material of the dielectric insulation layer 150 of the present embodiment is aluminum oxide or titanium oxide. A deposition rate of such a material is low and the material is not suitable for manufacturing the gate insulation layer 120. Consequently, the present embodiment adopts materials with various dielectric properties to manufacture respectively the gate insulation layer 120 and the dielectric insulation layer 150 to avoid longer period of time for manufacturing the gate insulation layer 120 that affects overall manufacture of the active device 102. Also, the dielectric insulation layer 150 can be utilized to provide desirable dielectric properties so as to fulfill the needed storage capacitor structure 104. For example, the dielectric insulation layer 150 has high dielectric index and thin film thickness which help to increase capacitance per unit area of the storage capacitor structure 104 and reduce a size of area of the storage capacitor structure 104.

Figure 5A:
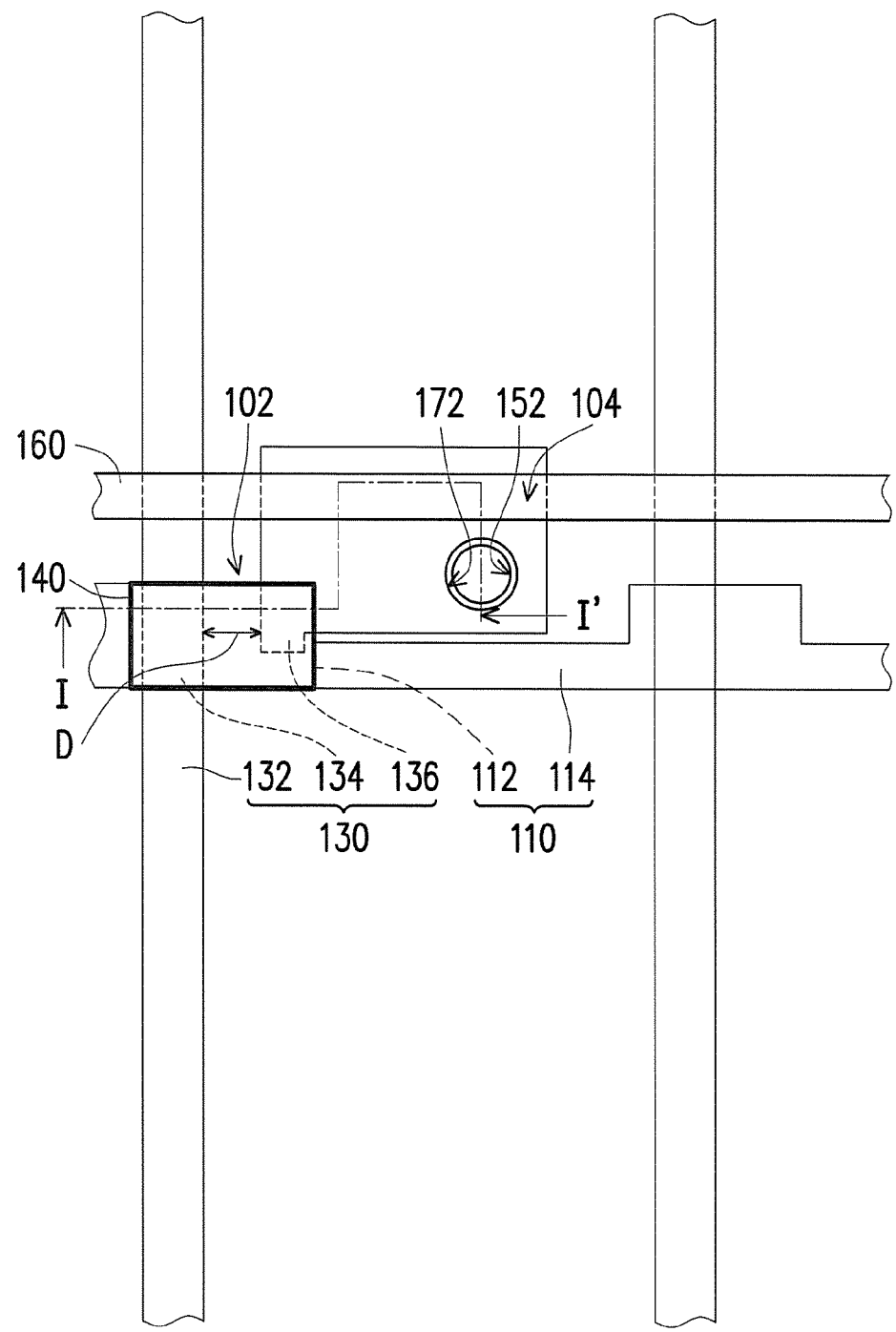
Figure 5B:
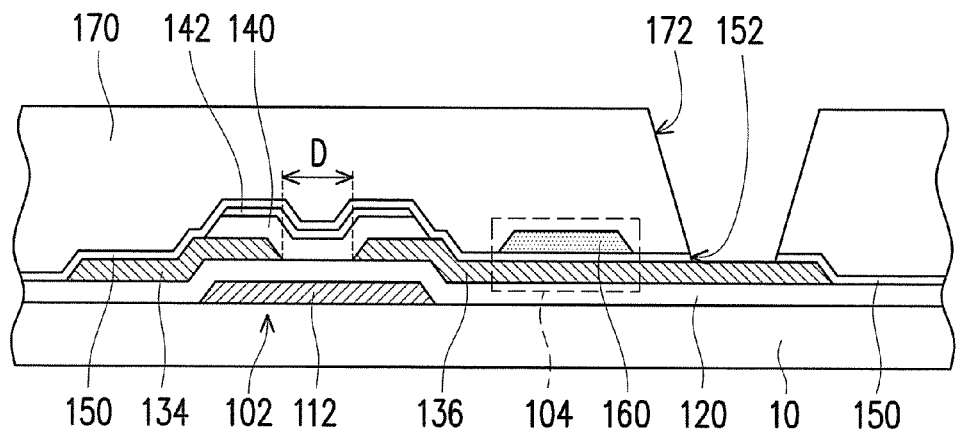

Next, referring to FIG. 5A and FIG. 5B, a protection layer 170 is formed on the dielectric insulation layer 150 such that the capacitance electrode 160 is sandwiched between the dielectric insulation layer 150 and the protection layer 170. In addition, further in the present embodiment, a first contact opening 152 is formed in the dielectric insulation layer 150 and a second contact opening 172 is formed in the protection layer 170. The drain 136 is exposed by the first contact opening 152 and the second contact opening 172 communicated with the first contact opening 152. Therefore, the drain 136 can be exposed by both the first contact opening 152 and the second contact opening 172 together.

Figure 6A:
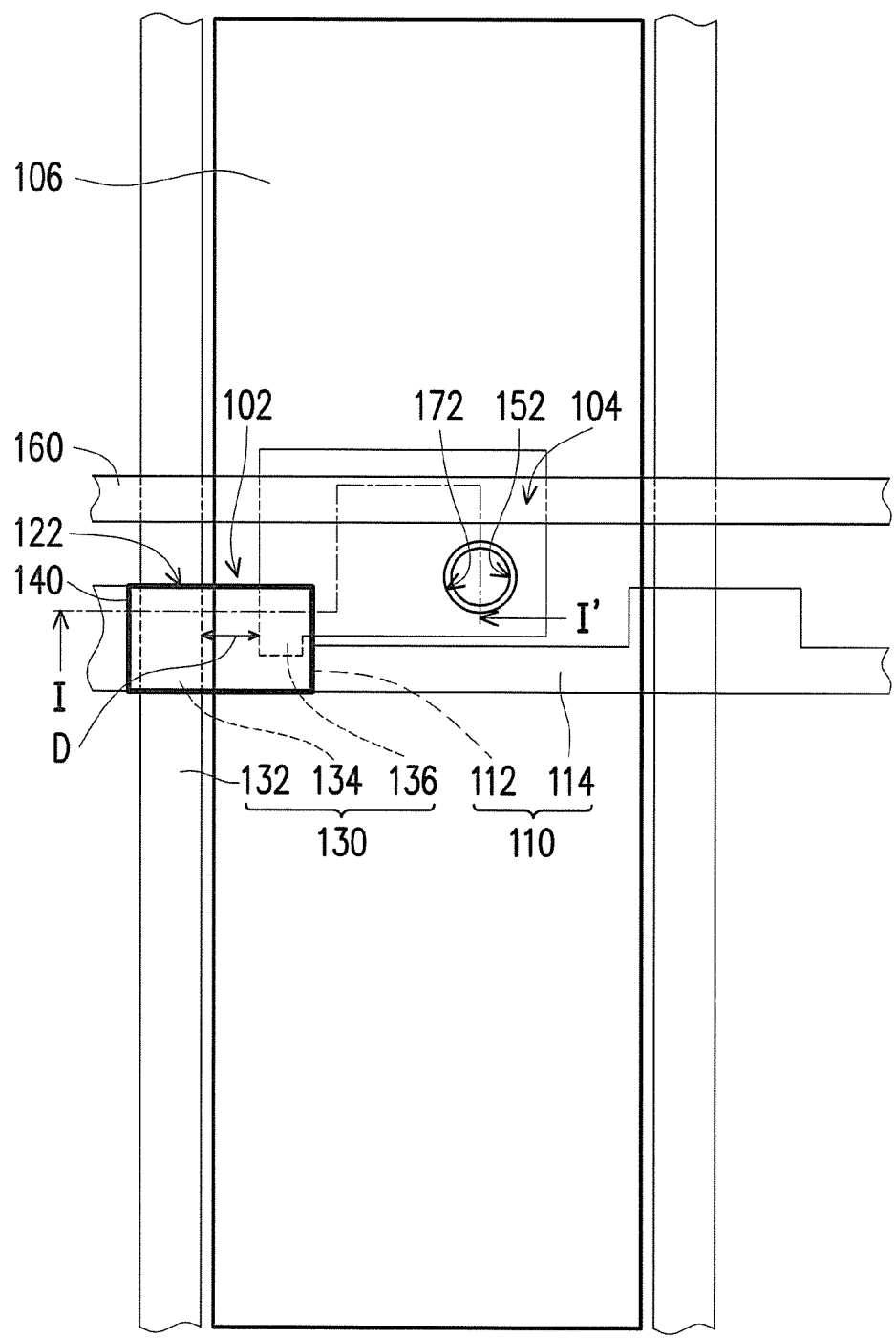
Figure 6B:
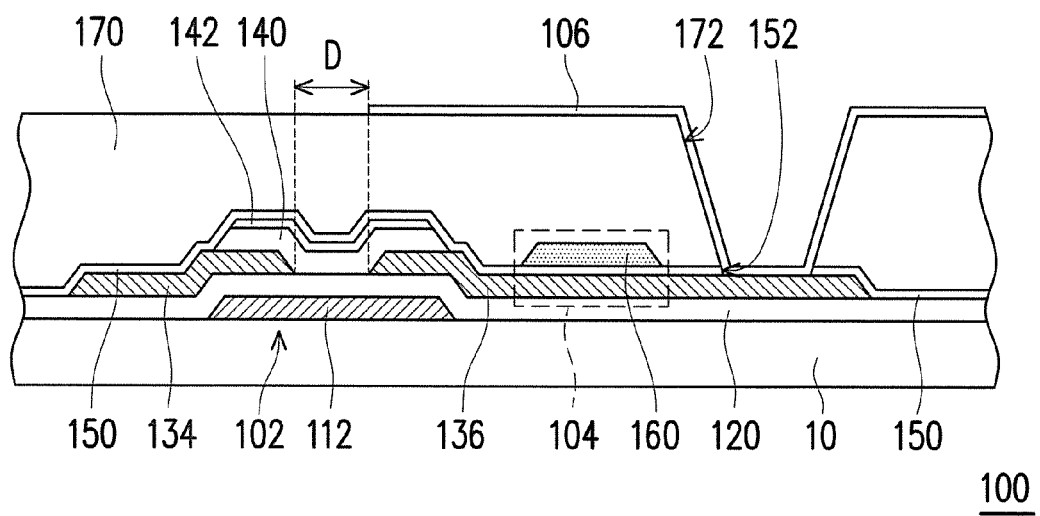

Later, referring to FIG. 6A and FIG. 6B, a pixel electrode 106 is formed on the substrate 10. The pixel electrode 106 is connected to the drain 136 via the first contact opening 152 and the second contact opening 172 so as to form a pixel structure 100 disposed on the substrate 10.

Specifically, the pixel structure 100 includes the active device 102, the gate insulation layer 120, the dielectric insulation layer 150, the capacitance electrode 160, the protection layer 170 and the pixel electrode 106. The active device 102 includes the gate 112, the semiconductor channel layer 140, the source 134 and the drain 136. The pixel electrode 106 is disposed above the protection layer 170 and connected to the drain 136 of the active device 102. The capacitance electrode 160 is disposed above the dielectric insulation layer 150 and the capacitance electrode 160 is overlapped with the drain 136 such that the capacitance electrode 160, the drain 136 and the dielectric insulation layer 150 sandwiched therebetween constitute the storage capacitor structure 104. The protection layer 170 is disposed above the dielectric insulation layer 150, and the capacitance electrode 160 is disposed between the protection layer 170 and the dielectric insulation layer 150. In addition, the dielectric insulation layer 150 is disposed above the substrate 10 and covers the semiconductor channel layer 140, the source 134 and the drain 136.

With regard to the active device 102, a gap D above the gate 112 is between the source 134 and the drain 136 such that the gate 112 has at least one portion that is not overlapped with the source 134 and the drain 136. Also, the semiconductor channel layer 140 at least is disposed in the gap D to be connected between the source 134 and the drain 136. The gate insulation layer 120 is disposed between the gate 112 and the semiconductor channel layer 140, and the source 134 and the drain 136 are disposed between the gate insulation layer 120 and the semiconductor channel layer 140. Therefore, the active device 102 can be a coplanar thin film transistor (TFT).

In the present embodiment, a dielectric index of the dielectric insulation layer 150 is greater than the dielectric index of the gate insulation layer 120, wherein the dielectric index of the dielectric insulation layer 150 ranges from 5 to 10. In addition, a film thickness of the dielectric insulation layer 150 ranges from 100 Å to 800 Å. As a result, the design of the present embodiment helps to obtain desirable capacitance for the storage capacitor structure 104 and keeps a minimum layout area, and increases a display aperture ratio for the pixel structure 100.

Generally speaking, a capacitor structure is constituted of two electrodes and a middle layer sandwiched between two electrodes. A capacitance of the capacitor structure is in direct proportion to an overlapping area of two electrodes and is in reverse proportion to a film thickness (distance between two electrodes) of the middle layer. In addition, the film thickness of the middle layer is related to a dielectric index of a material used for the middle layer. For example, in order to obtain same dielectric properties, the middle layer constituted by a high dielectric index material requires thinner film thickness while the middle layer constituted by a low dielectric index material requires thicker film thickness. Therefore, the middle layer constituted by materials with various dielectric indexes and sandwiched between two electrodes affects not only capacitance levels of the capacitor structure but also an overlapping area needed for two electrodes.

For example, the dielectric index of aluminum oxide is approximately 7. According to the design of the present embodiment, when the middle layer (i.e. the dielectric insulation layer 150) constituted by a material with a higher dielectric index (i.e. aluminum oxide) and sandwiched between the capacitance electrode 160 and the drain 136, the dielectric insulation layer 150 having a film thickness ranging approximately from 500 Å to 750 Å can provide sufficient dielectric properties. At this time, the storage capacitor structure 104 constituted by overlapping the capacitance electrode 160 and the drain 136 has a capacitance per unit area of approximately 1.239 fF/$\mu m^2$.

In a comparative example, the dielectric index of silicon oxide is approximately 3.8. When a middle layer constituted by a material having a lower dielectric index (i.e. silicon oxide) is sandwiched between two electrodes to form a storage capacitor structure, the middle layer having approximately 900 Å of a film thickness is capable of providing sufficient dielectric properties. At this time, the storage capacitor structure constituted by two overlapping electrodes has a capacitance per unit area of approximately 0.374 fF/$m^2$.

According to the capacitance per unit area, in order to execute a design having the same capacitance, an overlapping area of two electrodes of the capacitor structure in the comparative example is required to be approximately 3.313 times of the overlapping area of two electrodes, the capacitance electrode 160 and the drain 136, of the capacitor structure in the present embodiment. In other words, in the present embodiment, utilizing a material having a high dielectric index to manufacture the dielectric insulation layer 150 for forming the storage capacitor structure 104 helps to obtain desirable capacitance in a limited layout area, or helps to obtain the same capacitance in even smaller layout area. When the capacitance electrode 160 is manufactured with an opaque material (that is, the storage capacitance structure 104 is an opaque component), the design of the present embodiment has little negative impact on a display aperture ratio because the storage capacitor structure 104 requires smaller area.

In addition, the dielectric insulation layer 150 of the present embodiment is manufactured with a material having a high density such as aluminum oxide which has not only high dielectric properties but also further prevents semiconductor channel layer 140 from being damaged by external substances (such as moistures and the like). Therefore, in the pixel structure 100 of the present embodiment, when an oxide semiconductor material is used to form the semiconductor channel layer 140 disposed in the active device 102, the semiconductor channel layer 140 is capable of providing desirable electrical properties and is less prone to be damaged.

In summary, in the invention, a material having higher dielectric index is used as the dielectric insulation layer of the storage capacitor structure and helps to reduce the needed disposition area for the storage capacitor structure and further increases a display aperture ratio. Therefore, the pixel structure of the present embodiment according to the invention can obtain high display aperture ratio and sufficient storage capacitance.

Although the invention has been described with reference to the above embodiments, it is not intended to limit the invention thereto. It is apparent to people of the ordinary skill in the art that modifications and variations to the described embodiments may be made without departing from the spirit and scope of the invention. Accordingly, the scope of the invention will be defined by the attached claims and not by the above detailed descriptions.

What is claimed is:

1. A method of manufacturing a pixel structure comprising:
   forming a gate on a substrate;
   forming a gate insulation layer on the substrate to cover the gate;
   forming a source and a drain on the gate insulation layer, wherein the source and the drain both above the gate are separated by a gap such that the gate has at least a portion that is not overlapped with the source and the drain;
   forming a semiconductor channel layer above the source and the drain, wherein the semiconductor channel layer is at least disposed in the gap;
   forming a dielectric insulation layer on the substrate to cover the source, the drain and the semiconductor channel layer, wherein a dielectric index of the dielectric insulation layer is greater than a dielectric index of the gate insulation layer;
   forming a capacitance electrode on the dielectric insulation layer, wherein the capacitance electrode is overlapped with the drain such that the capacitance electrode, the drain and the dielectric insulation layer sandwiched between the capacitance electrode and the drain constitute a storage capacitor structure, wherein the capacitance electrode is not overlapping with the gate and the source;
   forming a protection layer on the dielectric insulation layer to cover the capacitance electrode; and
   forming a pixel electrode on the protection layer and connected to the drain.

2. The method as recited in claim 1, wherein the step of forming the source and the drain, the step of forming the dielectric insulation layer and the step of forming the capacitance electrode are processed in sequence.

3. The method as recited in claim 1, wherein a material of the dielectric insulation layer comprises aluminum oxide or titanium dioxide.

4. The method as recited in claim 1, wherein the dielectric index of the dielectric insulation layer ranges from 5 to 10.

5. The method as recited in claim 1, wherein the step of forming the semiconductor channel layer is processed after forming the source and the drain.

6. The method as recited in claim 1 further comprising forming a first contact opening in the dielectric insulation layer to expose the drain, and forming a second contact opening in the protection layer to be communicated with the first contact opening such that the pixel electrode manufactured subsequently is connected to the drain via the first contact opening and the second contact opening communicated with each other.

7. The method as recited in claim 1, wherein a material of the semiconductor channel layer comprises an oxide semiconductor material.

8. The method as recited in claim 7, further comprising a step of forming a channel protection layer on a top surface of the semiconductor channel layer.

9. The method as recited in claim 8, wherein the step of forming the channel protection layer comprises performing a nitridation process to the semiconductor channel layer in a chamber for depositing the oxide semiconductor material as the semiconductor channel layer.

10. The method as recited in claim 7, wherein the oxide semiconductor material comprises Indium-Gallium-Zinc Oxide (IGZO), Zinc Oxide (ZnO), Stannic Oxide (SnO), Indium-Zinc Oxide (IZO), Gallium-Zinc Oxide (GZO), Zinc-Tin Oxide (ZTO) or Indium-Tin Oxide (ITO).

11. The method as recited in claim 9, wherein a material of the channel protection layer comprises Indium-Gallium-Zinc Oxynitride (IGZON), Zinc Oxynitride (ZnON), Stannic Oxynitride (SnON), Indium-Zinc Oxynitride (IZON), Gallium-Zinc Oxynitride (GZON), Zinc-Tin Oxynitride (ZTON) or Indium-Tin Oxide Nitride (ITON).

* * * * *